(12) United States Patent
Heck

(10) Patent No.: US 8,310,284 B2
(45) Date of Patent: Nov. 13, 2012

(54) HIGH-VOLTAGE GATE DRIVER THAT DRIVES GROUP III-N HIGH ELECTRON MOBILITY TRANSISTORS

(75) Inventor: Karl Richard Heck, Phoenix, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 126 days.

(21) Appl. No.: 12/987,019

(22) Filed: Jan. 7, 2011

(65) Prior Publication Data

US 2012/0176162 A1 Jul. 12, 2012

(51) Int. Cl.
*H03B 1/00* (2006.01)
*H03K 3/00* (2006.01)

(52) U.S. Cl. .......................... 327/112; 327/108; 327/109

(58) Field of Classification Search .................. 327/108, 327/109, 112
See application file for complete search history.

(56) References Cited

U.S. PATENT DOCUMENTS

| 6,556,053 | B2* | 4/2003 | Stanley | 327/108 |
| 7,619,462 | B2 | 11/2009 | Kelly et al. | |
| 7,777,553 | B2 | 8/2010 | Friedrichs | |
| 2008/0253151 | A1 | 10/2008 | Bahramian | |
| 2009/0052216 | A1* | 2/2009 | Iwabuchi et al. | 363/132 |
| 2009/0278513 | A1 | 11/2009 | Bahramian et al. | |

OTHER PUBLICATIONS iP2010Pbf (PD-97461) Data Sheet, International Rectifier, www.irf.com.
Strydom, J., "How2 Get the Most Out of GaN Power Transistors", How2Power Today Your Power Design Newsletter, Jun. 2010, pp. 1-10.
Pytel, S.G. et al., "ALGAN/GAN MOSHFET Integrated Circuit Power Converter", Power Electronics Specialists Conference, 2004. PESC 04. 2004 IEEE 35th Annual, Jun. 2004, pp. 579-584 vol. 1 (attached pages unnumbered).

* cited by examiner

*Primary Examiner* — John Poos
(74) *Attorney, Agent, or Firm* — Eugene C. Conser; Wade J. Brady, III; Frederick J. Telecky, Jr.

(57) ABSTRACT

A Group III-N high electron mobility transistor is driven by a high-voltage gate driver that limits the gate-to-source voltage across the transistor by controlling the maximum charge that can be placed on a boot strap capacitor that charges up the gate of the transistor to turn on the transistor.

15 Claims, 3 Drawing Sheets

HIGH-VOLTAGE GATE DRIVER THAT DRIVES GROUP III-N HIGH ELECTRON MOBILITY TRANSISTORS

BACKGROUND OF THE INVENTION

1. Field of the Invention

The present invention relates to high-voltage gate drivers and, more particularly, to a high-voltage gate driver that drives Group III-N high electron mobility transistors.

2. Description of the Related Art

The LM5100A/LM5101A is a high-voltage gate driver manufactured by National Semiconductor Corporation of Santa Clara, Calif. that, along with a boot strap capacitor, independently drives both the high side and the low side n-channel MOSFETs in a synchronous buck converter or a half-bridge configuration.

FIG. 1 shows a schematic diagram that illustrates an example of a conventional step down circuit 100. As shown in FIG. 1, step down circuit 100 includes a gate driver 110 that has a lower driver circuit 112, an upper driver circuit 114, and a diode D1 that connects lower driver circuit 112 to upper driver circuit 114. Gate driver 110 can be implemented with, for example, a LM5100A/LM5101A gate driver.

As further shown in FIG. 1, lower driver circuit 112 includes a comparator 120 that is connected to a low input LI to receive a low input signal, and a driver 122 that receives the output from comparator 120. Driver 122, which is conventionally implemented, includes a drive circuit 124 and an output inverter 126 that is connected to drive circuit 124. Output inverter 126, in turn, includes a PMOS transistor P1 and a NMOS transistor N1.

PMOS transistor P1 has a source connected to an upper rail UR1, a drain connected to a low signal output LO, and a gate connected to the output of drive circuit 124. NMOS transistor N1 has a source connected to a lower rail LR1, a drain connected to the low signal output LO, and a gate connected to the output of drive circuit 124. Upper rail UR1 is connected to a power supply input VDDI to receive a power supply voltage VDD, while lower rail LR1 is connected to a ground input VSSI to receive ground.

Upper driver circuit 114 includes a comparator 130 that is connected to a high input HI to receive a high input signal, a level shifter 132 that receives the output from comparator 130, and a driver 134 that receives the output from level shifter 132. Driver 134, which is conventionally implemented, includes a drive circuit 136 and an output inverter 138 that is connected to drive circuit 136. Output inverter 138, in turn, includes a PMOS transistor P2 and a NMOS transistor N2.

PMOS transistor P2 has a source connected to an upper rail UR2, a drain connected to a high signal output HO, and a gate connected to the output of drive circuit 136. NMOS transistor N2 has a source connected to a lower rail LR2, a drain connected to the high signal output HO, and a gate connected to the output of drive circuit 136. Upper rail UR2 has an external connection HB, while lower rail LR2 has an external connection HS. In addition, diode D1 has an anode connected to the upper rail UR1 and a cathode connected to the upper rail UR2.

As additionally shown in FIG. 1, step down circuit 100 includes a power supply smoothing capacitor C1 that is connected to the power supply input VDDI and the ground input VSSI, and a boot strap capacitor C2 that is connected to the external connection HB (and thereby upper rail UR2) and the external connection HS (and thereby lower rail LR2).

Further, step down circuit 100 includes a synchronous buck converter 140 that is connected to gate driver 110. Buck converter 140 includes a lower NMOS transistor Q1 and an upper NMOS transistor Q2. Lower NMOS transistor Q1 has a source connected to ground, a drain connected to the external connection HS (and thereby lower rail LR2), and a gate connected to the low signal output LO.

Upper NMOS transistor Q2 has a drain connected to a power supply voltage VCC, a source connected to the external connection HS (and thereby lower rail LR2), and a gate connected to the high signal output HO. Power supply voltage VCC can be substantially larger than power supply voltage VDD, e.g., 100V versus 5V.

In addition, buck converter 140 also includes an inductor L, a buck capacitor C3, and a load 142. Inductor L has a first end that is connected to the external connection HS (and thereby lower rail LR2), while buck capacitor C3 and load 142 are both connected between a second end of inductor L and ground.

In operation, when the low input signal received by low input LI is a logic high and the high input signal received by high input HI is a logic low, drive circuit 124 outputs a logic low and drive circuit 136 outputs a logic high. The output from drive circuit 124 turns on PMOS transistor P1 and turns off NMOS transistor N1 of output inverter 126, while the output from drive circuit 136 turns on NMOS transistor N2 and turns off PMOS transistor P2 of output inverter 138.

When PMOS transistor P1 turns on, PMOS transistor P1 places the power supply voltage VDD on the gate of NMOS transistor Q1, which turns on transistor Q1. During initial start up, when NMOS transistor Q1 turns on, transistor Q1 places ground on the bottom plate of boot strap capacitor C2, which causes the top plate of boot strap capacitor C2 to charge up to the power supply voltage VDD less the voltage drop VD1 across diode D1, or VDD–VD1. When NMOS transistor N2 turns on, NMOS transistor N2 places ground on the gate of NMOS transistor Q2, which turns off transistor Q2.

When the signals input to gate driver 110 are to change states, the low input signal received by low input LI changes state to a logic low before the high input signal received by high input HI changes state to a logic high which, in turn, causes the output of driver 122 to change state before the output of driver 134 changes state. This is to insure that no shoot through current can flow through upper transistor Q2 and lower transistor Q1 to ground. (The timing of the low input signal and the high input signal are externally controlled.)

When the low input signal received by low input LI changes state to a logic low, the output of drive circuit 124 changes state and outputs a logic high. The logic high turns off PMOS transistor P1 and turns on NMOS transistor N1. When NMOS transistor N1 turns on, NMOS transistor N1 places ground on the gate of NMOS transistor Q1, which turns off NMOS transistor Q1.

When the high input signal received by high input HI next changes state to a logic high, the output of drive circuit 136 changes state and outputs a logic low. The logic low turns on PMOS transistor P2 and turns off NMOS transistor N1. When PMOS transistor P2 turns on, the voltage VDD–VD1 on the top plate of boot strap capacitor C2 charges up the gate of NMOS transistor Q2 to turn on transistor Q2.

Thus, when PMOS transistor P2 turns on, a finite or fixed amount of charge is taken from boot strap capacitor C2 to turn on transistor Q2. (Although the voltage on the top plate of boot strap capacitor C2 is slightly less than the voltage VDD–VD1 after turning on transistor Q2, the following discussion assumes that the voltage on the top plate of boot strap capacitor C2 continues to be equal to VDD–VD1 for simplicity.)

When NMOS transistor Q2 turns on, a current flows through NMOS transistor Q2 and inductor L to charge up buck capacitor C3 and provide current to load 142. In addition, the voltage on the source of NMOS transistor Q2 and the bottom plate of boot strap capacitor C2 rises to the power supply voltage VCC. The rising voltage on the bottom plate of boot strap capacitor C2 pushes up the voltage on the top plate of boot strap capacitor C2 to a voltage equal to VDD−VD1+VCC, which is also placed on the gate of transistor Q2.

However, since the voltage on the source of NMOS transistor Q2 is equal to the power supply voltage VCC, the gate-to-source voltage of NMOS transistor Q2 remains equal to VDD−VD1 ((VDD−VD1+VCC)−VCC). Thus, even though the voltage on the source of NMOS transistor Q2 can rise to value of, for example, 100V, the voltage has no effect on the operation of NMOS transistor Q2.

When the signals input to gate driver 110 are to change states again, the high input signal received by high input HI changes state to a logic low before the low input signal received by low input LI changes state to a logic high to prevent a shoot through current which, in turn, causes the output of driver 134 to change state before the output of driver 122 changes state.

When the high input signal received by high input HI changes state to a logic low, the output of drive circuit 136 changes state and outputs a logic high. The logic high turns on NMOS transistor N2 and turns off PMOS transistor P2. When NMOS transistor N2 turns on, the voltage on the gate of NMOS transistor Q2 falls, and turns off NMOS transistor Q2 when the voltage on the gate of transistor Q2 is less than a threshold voltage above the voltage on the source of NMOS transistor Q2.

Due to the energy stored in inductor L, inductor L continues to source current to buck capacitor C3 and load 142. To do this, inductor L pulls the voltage on the gate and source of NMOS transistor Q2, along with the voltage on the bottom plate of boot strap capacitor C2, down to a voltage of −VD2, where the voltage −VD2 is the voltage drop across the body diode of NMOS transistor Q1.

As the voltage on the bottom plate of boot strap capacitor C2 falls from the power supply voltage VCC to ground, the voltage on the top plate of boot strap capacitor C2 also falls from VDD−VD1+VCC to VDD−VD1. However, as the voltage on the bottom plate of boot strap capacitor C2 falls from ground to −VD2, the voltage across boot strap capacitor C2 is charged up by way of diode D1 to VDD−VD1+VD2.

When the low input signal received by low input LI next changes state to a logic high, the output of drive circuit 124 changes state and outputs a logic low. The logic low turns on PMOS transistor P1 and turns off NMOS transistor N1. When PMOS transistor P1 turns on, PMOS transistor P1 places the power supply voltage VDD on the gate of NMOS transistor Q1, which turns on transistor Q1. When NMOS transistor Q1 turns on, transistor Q1 closes a loop which lets a current flow from inductor L through load 142 and back through NMOS transistor Q1 to inductor L.

When the signals input to gate driver 110 next change states, the low input signal received by low input LI changes state to a logic low before the high input signal received by high input HI changes state to a logic high to prevent a shoot through current which, in turn, causes the output of driver 122 to change state before the output of driver 134 changes state.

When the low input signal received by low input LI changes state to a logic low, the output of drive circuit 124 changes state and outputs a logic high. The logic high turns off PMOS transistor P1 and turns on NMOS transistor N1. When NMOS transistor N1 turns on, NMOS transistor N1 places ground on the gate of NMOS transistor Q1, which turns off NMOS transistor Q1. At this time, the external connection HS (and thereby lower rail LR2) swings negative again and refreshes the charge across boot strap capacitor C2 to VDD−VD1+VD2.

When the high input signal received by high input HI next changes state to a logic high, the output of drive circuit 136 changes state and outputs a logic low. The logic low turns on PMOS transistor P2 and turns off NMOS transistor N2. When PMOS transistor P2 turns on, the charged up voltage VDD−VD1+VD2 on the top plate of boot strap capacitor C2 charges up the gate of NMOS transistor Q2 to turn on NMOS transistor Q2.

When NMOS transistor Q2 turns on, a current again flows through NMOS transistor Q2 and through inductor L to charge up buck capacitor C3 and provide current to load 142. In addition, the voltage on the source of NMOS transistor Q2 rises from the voltage −VD2 to the power supply voltage VCC.

Thus, when NMOS transistor Q2 is turned on, the gate-to-source voltage of NMOS transistor Q2 is equal to VDD−VD1+VD2. Since transistor Q1 is implemented as a MOS transistor, the voltage drop VD1 of diode D1 and the voltage drop VD2 of the body diode of transistor Q1 are approximately equal (e.g., 0.7V) and cancel each other out. As a result, the gate-to-source voltage of NMOS transistor Q2 is approximately equal to VDD−VD1+VD2, or VDD.

However, when transistors Q1 and Q2 are each implemented with a Group III-N high electron mobility transistor (HEMT), such as a GaN transistor, rather than MOS transistors, the voltage drop across transistor Q1 is much larger. For example, a GaN transistor has no body diode. As a result, when transistors Q1 and Q2 are both turned off, the voltage on the bottom plate of boot strap capacitor C2 is pulled down to approximately 2.5V before transistor Q1 turns on in reverse. Thus, substituting in exemplary numbers for the gate-to-source voltage of VDD−VD1+VD2 yields 5V−0.7V+2.5V or 6.8V, when transistor Q2 is implemented with a GaN transistor.

Although MOS transistors can withstand gate-to-source voltages of up to 20V, GaN transistors are damaged when the gate-to-source voltage exceeds approximately 6.0V. Over a period of time, this damage will result in the failure of the GaN transistors. As a result, GaN transistors can not be reliably substituted for NMOS transistors Q1 and Q2. Thus, there is a need for a circuit which can utilize a Group III-N HEMT in lieu of each of the NMOS transistors Q1 and Q2 without damaging the Group III-N HEMT utilized for transistor Q2.

DETAILED DESCRIPTION OF THE INVENTION

Figure 1:
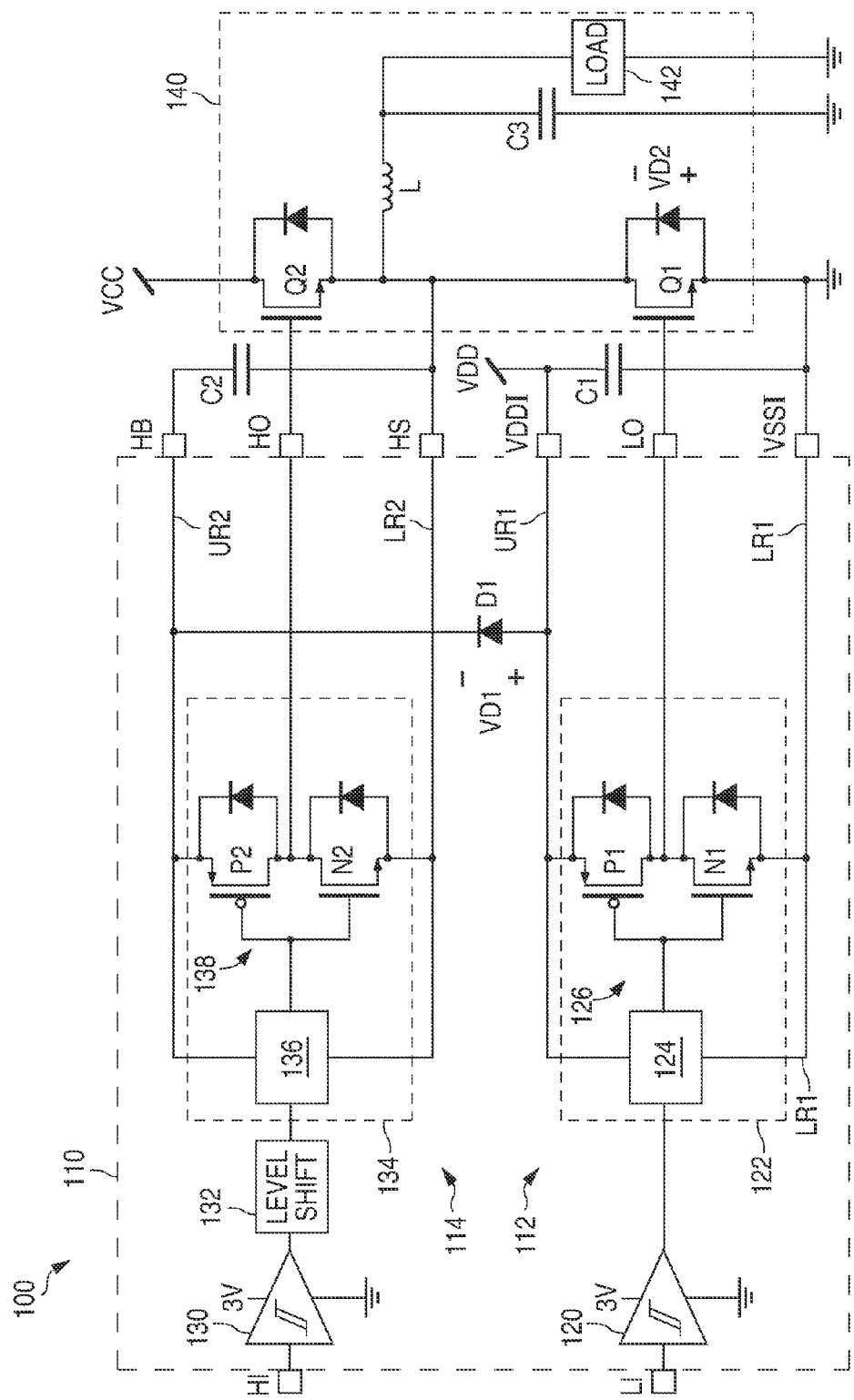
FIG. 1 is a schematic diagram illustrating an example of a conventional step down circuit 100.
Figure 2:
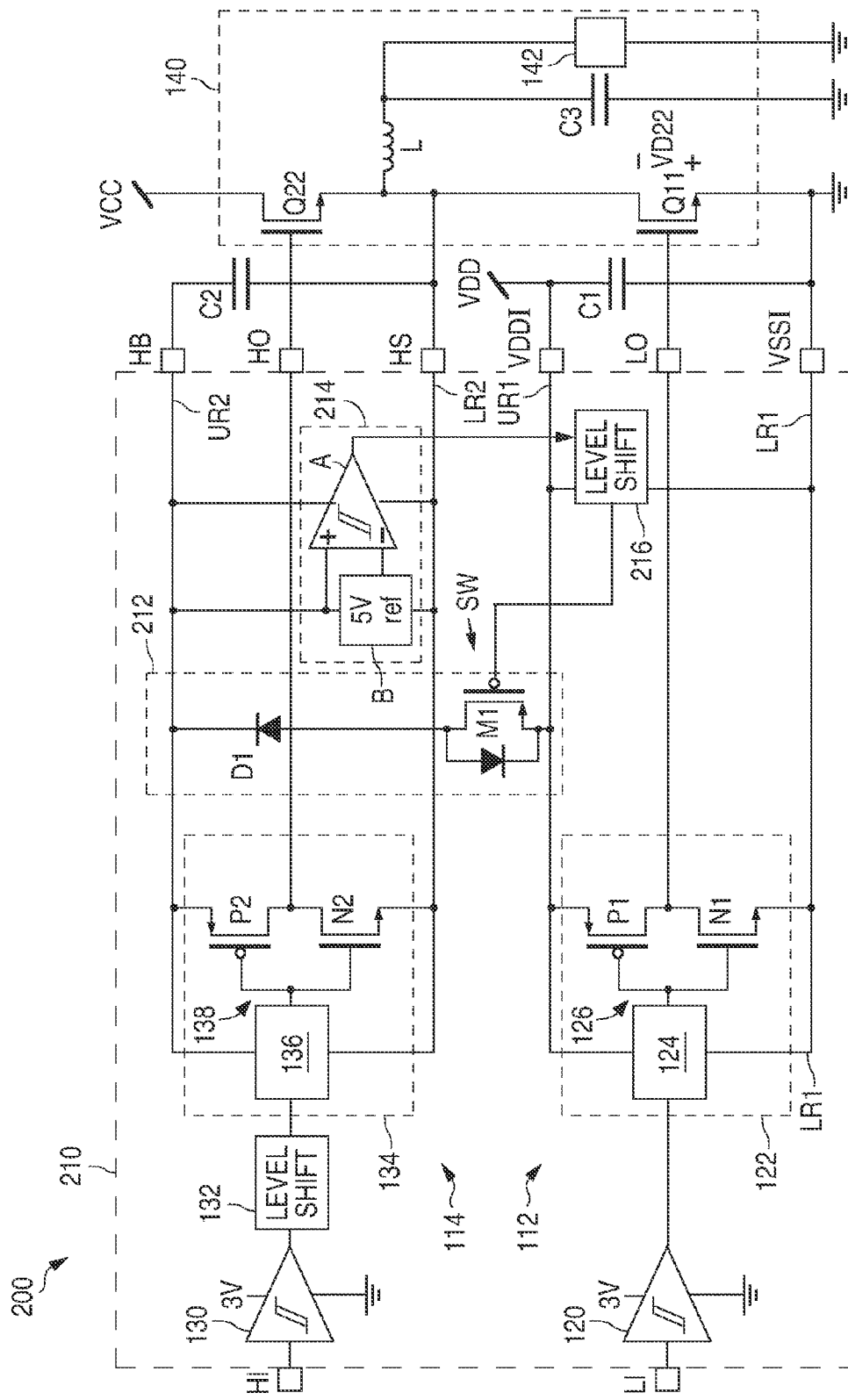
FIG. 2 is a schematic diagram illustrating an example of a step down circuit 200 in accordance with the present invention.

FIG. 2 shows a schematic diagram that illustrates an example of a step down circuit 200 in accordance with the present invention. Step down circuit 200 is similar to step down circuit 100 and, as a result, utilizes the same reference numerals to designate the structures which are common to both circuits.

As shown in FIG. 2, step down circuit 200 differs from step down circuit 100 in that step down circuit 200 utilizes lower and upper transistors Q11 and Q22 in lieu of lower and upper transistors Q1 and Q2, respectively. Lower transistor Q11 has a source connected to ground, a drain connected to the external connection HS (and thereby lower rail LR2), and a gate connected to the low signal output LO.

Upper transistor Q22 has a drain connected to the power supply voltage VCC, a source connected to the external connection HS (and thereby lower rail LR2), and a gate connected to the high signal output HO. In accordance with the present invention, transistors Q11 and Q22 are each implemented with a Group III-N HEMT, such as a GaN transistor.

In addition to the above, step down circuit 200 differs from step down circuit 100 in that step down circuit 200 utilizes a gate driver 210 in lieu of gate driver 110. Gate driver 210, in turn, is the same as gate driver 110 except that gate driver 210 utilizes a switched diode circuit 212 in lieu of diode D1. Switched diode circuit 212, which is connected to upper rail UR1 and upper rail UR2, includes diode D1 and a switch SW that are connected in series. In the present example, switch SW is implemented with a PMOS transistor M1. PMOS transistor M1 has a drain connected to the anode of diode D1, a source connected to the upper rail UR1, and a gate.

Further, gate driver 210 includes a difference circuit 214 that is connected to the upper and lower rails UR2 and LR2. Difference circuit 214, in turn, can be implemented with a conventional voltage comparator A, and a reference voltage source B that provides a reference voltage to comparator A. In the present example, the reference voltage generated by the reference voltage source B is equal to 5V. In addition, the externally provided power supply voltage VDD is assumed to be equal to 5V. Gate driver 210 also includes a level shifter 216 that is connected to the output of difference circuit 214, the input of switch SW (the gate of transistor M1), and the upper and lower rails UR1 and LR1.

Step down circuit 200 operates the same as step down circuit 100 except that step down circuit 200 controls the voltages across boot strap capacitor C2. In operation, difference circuit 214 determines a voltage difference from the second upper rail UR2 to the second lower rail LR2 (which is the voltage across boot strap capacitor C2), generates a logic high when the voltage difference (the voltage across boot strap capacitor C2) rises above an upper threshold voltage, and generates a logic low when the voltage difference (the voltage across boot strap capacitor C2) falls below a lower threshold voltage. In the present example, difference circuit 214 has an upper threshold voltage of approximately 5.2V, and a lower threshold voltage of approximately 4.8V.

As discussed above, when transistor Q1 is turned off and transistor Q2 then turns off, due to the energy stored in inductor L, inductor L continues to source current to buck capacitor C3 and load 142. To do this, inductor L pulls the voltage on the gate and source of NMOS transistor Q2, along with the voltage on the bottom plate of boot strap capacitor C2, down to a voltage of −VD2, which is the voltage drop across the body diode of transistor Q1.

Similarly, when transistor Q11 is turned off and transistor Q22 then turns off, due to the energy stored in inductor L, inductor L continues to source current to buck capacitor C3 and load 142. To do this, inductor L pulls the voltage on the gate and source of transistor Q22, along with the voltage on the bottom plate of boot strap capacitor C2, down to a voltage of −VD22, which is the voltage drop required to turn on transistor Q11 in the reverse direction.

As the voltage on the bottom plate of boot strap capacitor C2 in step down circuit 100 falls from the power supply voltage VCC to ground, the voltage on the top plate of boot strap capacitor C2 also falls from the voltage VDD−VD1+VCC to VDD−VD1. Thus, the voltage across boot strap capacitor C2 remains the same as the voltage on the bottom plate of boot strap capacitor C2 falls from the power supply voltage VCC down to ground. Similarly, the voltage across boot strap capacitor C2 in step down circuit 200 remains the same as the voltage on the bottom plate of boot strap capacitor C2 falls from the power supply voltage VCC down to ground.

In addition, as the voltage on the bottom plate of boot strap capacitor C2 in step down circuit 100 falls from ground towards the voltage −VD2, the voltage across boot strap capacitor C2 is charged up by way of diode D1. Thus, the voltage across boot strap capacitor C2 rises from the voltage VDD−VD1 to the voltage VDD−VD1+VD2.

However, in accordance with the present invention, as the voltage across boot strap capacitor C2 in step down circuit 200 rises from the voltage VDD−VD1 towards the voltage VDD−VD1+VD22, the rising voltage causes the output of difference circuit 214 to output a logic high when the voltage difference from the upper rail UR2 to the lower rail LR2 (the voltage across boot strap capacitor C2) reaches the upper threshold voltage (approximately 5.2V in the present example).

The logic high output by difference circuit 214 is level shifted down by level shifter 216, and then output to switch SW. The level shifted logic high output by level shifter 216 causes switch SW to open and electrically disconnect the anode of diode D1 from the power supply voltage VDD. In the present example, the logic high output by difference circuit 214 is level shifted down by level shifter 216, and then output to PMOS transistor M1. The level-shifted logic high output by level shifter 216 to PMOS transistor M1 turns off PMOS transistor M1, thereby preventing any further current from flowing through diode D1.

As a result, switch SW (PMOS transistor M1) prevents the voltage on the top plate of boot strap capacitor C2 from charging up to the voltage VDD−VD1+VD22. Instead, switch SW (PMOS transistor M1) limits the maximum voltage across boot strap capacitor C2 to the upper threshold voltage (approximately 5.2V in the present example).

In addition, as also discussed above, when PMOS transistor P2 turns on, the voltage on the top plate of boot strap capacitor C2 charges up the gate of NMOS transistor Q2 to turn on NMOS transistor Q2. Thus, each time PMOS transistor P2 turns on, a finite or fixed amount of charge is taken from boot strap capacitor C2 to turn on transistor Q2.

Similarly, when PMOS transistor P2 in step down circuit 200 turns on, the voltage on the top plate of boot strap capacitor C2 charges up the gate of NMOS transistor Q22 to turn on NMOS transistor Q22. Thus, each time PMOS transistor P2 turns on, a finite or fixed amount of charge is taken from boot strap capacitor C2 to turn on transistor Q22.

However, since switch SW is open (PMOS transistor M1 is turned off), the voltage on the top plate of boot strap capacitor C2 slowly falls over a number of cycles. When the finite or fixed amount of charge is taken from boot strap capacitor C2 to turn on transistor Q22 and the loss of charge from boot strap capacitor C2 causes the voltage across boot strap capacitor C2 to fall below the lower threshold voltage (approximately 4.8V in the present example), the falling voltage causes difference circuit 214 to output a logic low.

The logic low output by difference circuit 214 is input to level shifter 216 and then output to switch SW, which causes switch SW to close and electrically connect the anode of diode D1 to the power supply voltage VDD. In the present example, the logic low output by difference circuit 214 is input to level shifter 216 and then output to the gate of PMOS transistor M1. The logic low output by level shifter 216 to PMOS transistor M1 turns on PMOS transistor M1, thereby allowing current to again flow through diode D1. As a result, switch SW (PMOS transistor M1) allows the voltage on the top plate of boot strap capacitor C2 to again charge up to the voltage VDD−VD1.

The voltage across boot strap capacitor C2 is then charged up until the voltage across boot strap capacitor C2 rises to the upper threshold voltage (approximately 5.2V in the present example). At this point, as discussed above, difference circuit 214 and level shifter 216 cause switch SW to again open, thereby limiting the maximum voltage across boot strap capacitor C2 to the upper threshold voltage (approximately 5.2V in the present example).

Thus, switch SW (PMOS transistor M1) allows the voltage across boot strap capacitor C2 to be charged back up when the voltage across boot strap capacitor C2 falls below the lower threshold voltage (approximately 4.8V in the present example). As a result, the present invention allows each of the NMOS transistors in a synchronous buck converter or a half-bridge configuration to be replaced with a Group III-N HEMT.

Figure 3:
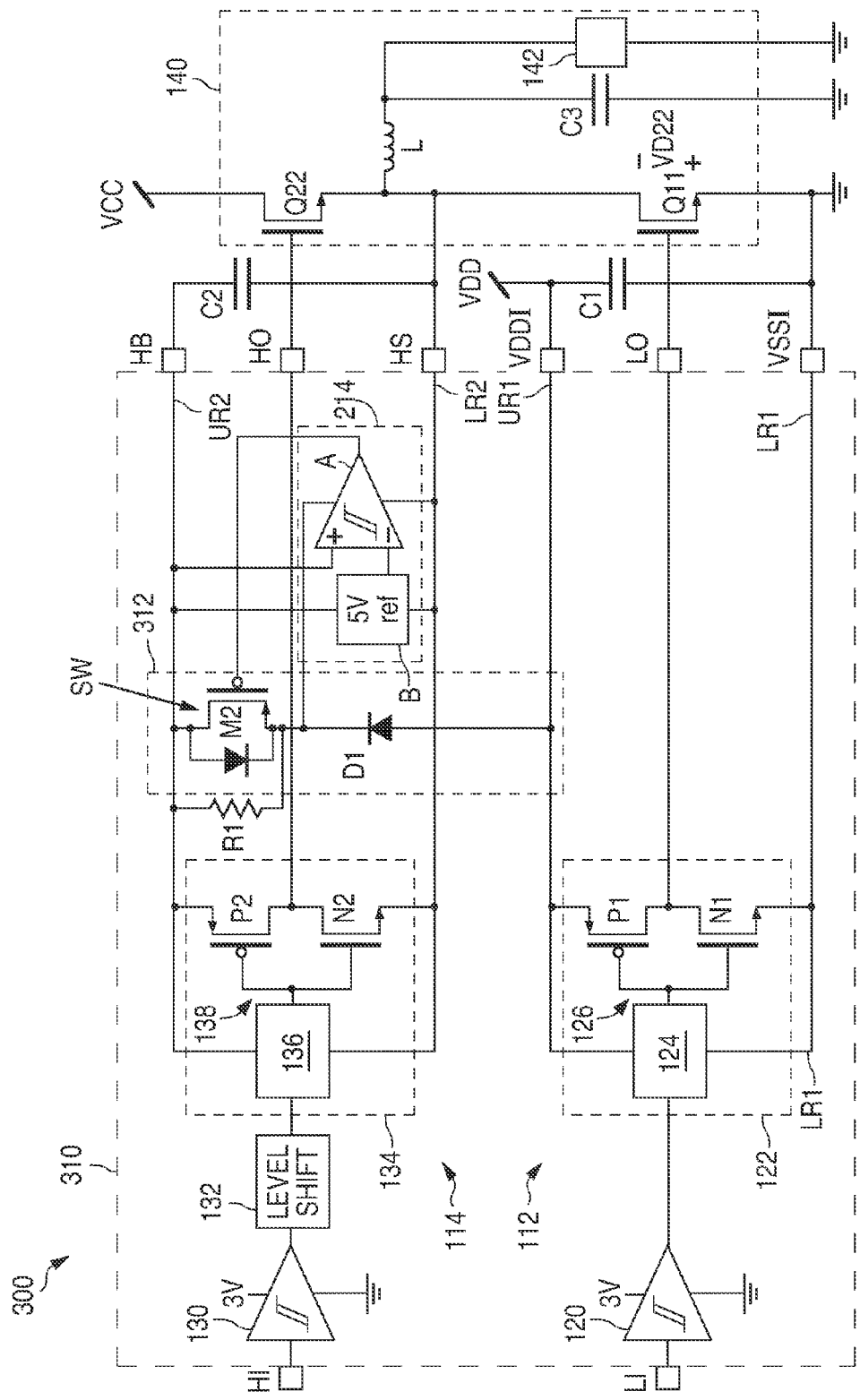
FIG. 3 is a schematic diagram illustrating an example of a step down circuit 300 in accordance with the present invention.

FIG. 3 shows a schematic diagram that illustrates an example of a step down circuit 300 in accordance with an alternate embodiment of the present invention. Step down circuit 300 is similar to step down circuit 200 and, as a result, utilizes the same reference numerals to designate the structures which are common to both circuits.

As shown in FIG. 3, step down circuit 300 differs from step down circuit 200 in that step down circuit 300 utilizes a gate driver 310 in lieu of gate driver 210. Gate driver 310 is the same as gate driver 210 except that gate driver 310 utilizes a switched diode circuit 312 in lieu of switched diode circuit 212.

Switched diode circuit 312, which is connected to the upper rail UR1 and the upper rail UR2, includes diode D1 and a switch SW that are connected in series. In the present example, switch SW is implemented with a PMOS transistor M2. PMOS transistor M2 has a drain connected to the upper rail UR2, a source connected to the cathode of diode D1, and a gate connected to the output of difference circuit 214. Further, gate driver 310 includes a resistor R1 that is connected to the cathode of diode D1 and the upper rail UR2.

Step down circuit 300 operates the same as step down circuit 200 except that step down circuit 300 alternately controls the voltages across the plates of boot strap capacitor C2. As with step down circuit 200, as the difference voltage from the upper rail UR2 to the lower rail LR2 (the voltage across boot strap capacitor C2) rises from the voltage VDD−VD1 towards the voltage VDD−VD1+VD22, the rising voltage causes the output of difference circuit 214 to output a logic high when the difference voltage (the voltage across boot strap capacitor C2) exceeds the upper threshold voltage (approximately 5.2V in the present example).

The logic high output by difference circuit 214 opens switch SW (turns off PMOS transistor M2), thereby preventing any further current from flowing through switch SW (PMOS transistor M2). As a result, switch SW (PMOS transistor M2) prevents the voltage across boot strap capacitor C2 from charging up to the voltage VDD−VD1+VD22. Instead, switch SW (PMOS transistor M2) limits the maximum voltage across boot strap capacitor C2 to substantially the upper threshold voltage (approximately 5.2V in the present example).

Resistor R1 provides a current path from the cathode of diode D1 to the top plate of boot strap capacitor C2 during initial start up in case switch SW is open (PMOS transistor M2 is turned off) when step down circuit 300 is initially powered up. Resistor R1 has a large value that limits current flow during normal operation. As a result, when switch SW is open (transistor M2 is turned off) during normal operation, only a negligible current flows through resistor R1.

Further, as with step down circuit 200, each time PMOS transistor P2 turns on, a finite or fixed amount of charge is taken from boot strap capacitor C2 to turn on transistor Q22. Thus, since switch SW is open (PMOS transistor M2 is turned off), the voltage on the top plate of boot strap capacitor C2 slowly falls over a number of cycles.

When the finite or fixed amount of charge is taken from boot strap capacitor C2 to turn on transistor Q22 and the loss of charge from boot strap capacitor C2 causes the voltage across boot strap capacitor C2 to fall below the lower threshold voltage (approximately 4.8V in the present example), the falling voltage causes difference circuit 214 to output a logic low.

The logic low output by difference circuit 214 closes switch SW (turns on PMOS transistor M2), which allows current to again flow from diode D1 to boot strap capacitor C2. As a result, switch SW (PMOS transistor M2) allows the voltage on the top plate of boot strap capacitor C2 to again charge up to the voltage VDD−VD1.

The voltage across boot strap capacitor C2 is then charged up until the voltage across boot strap capacitor C2 rises to the upper threshold voltage (approximately 5.2V in the present example). At this point, as discussed above, difference circuit 214 causes switch SW to again open, thereby limiting the maximum voltage across boot strap capacitor C2 to the upper threshold voltage (approximately 5.2V in the present example).

Thus, switch SW (PMOS transistor M2) prevents the voltage across boot strap capacitor C2 from exceeding the upper threshold voltage which, in turn, prevents the gate-to-source voltage of transistor Q22 (a Group III-N HEMT) from exceeding the upper threshold voltage (approximately 5.2V in the present example). As a result, the present invention allows each of the NMOS transistors in a synchronous buck converter or a half-bridge configuration to be replaced with a Group III-N HEMT.

Comparator A in difference circuit 214 has a power input that is connected to the cathode of diode D1. In step down circuit 300, the output stage of comparator A must be able to drive the gate of PMOS transistor M2 to the potential on the cathode of diode D1 to properly turn off transistor M2. If the voltage provided to the power input of comparator A was tied to the upper rail UR2, then the output of comparator A could only be driven to the potential on the upper rail UR2 which might not be enough to keep transistor M2 turned off.

The above discussion describes boot strap capacitor C2 charging up in one cycle. In actual practice, boot strap capacitor C2 charges up over a number of cycles. The amount of charge delivered to boot strap capacitor C2 when transistors Q11 and Q22 are both turned off is defined by the period of time that both transistors Q11 and Q22 are turned off, which is known as the dead time, multiplied by the forward current. The forward current, in turn, is defined by the impedance of diode D1.

As a result, the amount of charge acquired by boot strap capacitor C2 when transistors Q11 and Q22 are both turned off can be varied by varying the impedance of diode D1 and/or the dead time (the period of time that both transistors are turned off). There is an internal diode resistance (e.g., 1 ohm) in diode D1 that limits how much current can flow from the power supply input VDDI to the top plate of boot strap capacitor C2.

Thus, by increasing the impedance of diode D1 (which reduces the forward current to capacitor C2) and/or reducing the dead time, less charge is delivered to boot strap capacitor C2 during each cycle. As a result, by varying the dead time and/or the impedance of diode D1, more cycles can be required to charge boot strap capacitor C2 to the upper threshold voltage (approximately 5.2V in the present example). However, variations in the dead time and/or impedance must ensure that enough charge is placed on boot strap capacitor C2 during each cycle to compensate for the charge that is lost each time transistor Q22 is turned on.

It should be understood that the above descriptions are examples of the present invention, and that various alternatives of the invention described herein may be employed in practicing the invention. For example, although the present invention was described as driving a buck converter that includes a Group III-N HEMT, the present invention is not limited to driving a buck converter, and can be used to drive other circuits, such as a half bridge circuit, that include a Group III-N HEMT. Thus, it is intended that the following claims define the scope of the invention and that structures and methods within the scope of these claims and their equivalents be covered thereby.

What is claimed is:

1. A gate driver comprising:
a lower driver circuit having a lower inverter, the lower inverter having a signal input, a signal output, a power input connected to a first upper rail, and a ground input connected to a first lower rail;
an upper driver circuit having an upper inverter, the upper inverter having a signal input, a signal output, a power input connected to a second upper rail, and a ground input connected to a second lower rail;
a comparison circuit connected to the second upper rail and the second lower rail, the comparison circuit determining a voltage difference from the second upper rail to the second lower rail;
wherein the comparison circuit outputs a first logic state when the voltage difference is greater than an upper threshold voltage.

2. The gate driver of claim 1 wherein the comparison circuit outputs a second logic state when the voltage difference is less than a lower threshold voltage.

3. The gate driver of claim 2 and further comprising a switched diode circuit connected to the first upper rail and the second upper rail.

4. The gate driver of claim 3 wherein the switched diode circuit includes a diode and a switch connected to the diode in series.

5. The gate driver of claim 4 wherein a current flows from the first upper rail to the second upper rail through the diode and the switch when the switch is closed.

6. The gate driver of claim 5 wherein no current flows from the first upper rail to the second upper rail through the diode and the switch when the switch is opened.

7. The gate driver of claim 6 wherein the anode of the diode is connected to the first upper rail.

8. The gate driver of claim 6 wherein the cathode of the diode is connected to the second upper rail.

9. A gate driver comprising:
a lower driver circuit having a lower inverter, the lower inverter having a signal input, a signal output, a power input connected to a first upper rail, and a ground input connected to a first lower rail;
an upper driver circuit having an upper inverter, the upper inverter having a signal input, a signal output, a power input connected to a second upper rail, and a ground input connected to a second lower rail;
a switched diode circuit connected to the first upper rail and the second upper rail, the switched diode circuit including a diode and a switch connected to the diode in series;
wherein a current flows from the first upper rail to the second upper rail through the diode and the switch when the switch is closed.

10. The gate driver of claim 9 wherein no current flows from the first upper rail to the second upper rail through the diode and the switch when the switch is opened.

11. The gate driver of claim 10 wherein the anode of the diode is connected to the first upper rail.

12. The gate driver of claim 10 wherein the cathode of the diode is connected to the second upper rail.

13. The gate driver of claim 10 and further comprising a comparison circuit connected to the second upper rail and the second lower rail, the comparison circuit determining a voltage difference from the second upper rail to the second lower rail.

14. The gate driver of claim 13 wherein the comparison circuit outputs a first logic state when the voltage difference is greater than an upper threshold voltage.

15. The gate driver of claim 14 wherein the comparison circuit outputs a second logic state when the voltage difference is less than a lower threshold voltage.

* * * * *